United States Patent [19]

Butler et al.

[11] 4,165,478

[45] Aug. 21, 1979

[54] REFERENCE VOLTAGE SOURCE WITH TEMPERATURE-STABLE MOSFET AMPLIFIER

[75] Inventors: Walter J. Butler, Scotia; Charles W. Eichelberger, Schenectady, both of N.Y.

[73] Assignee: General Electric Company, Schenectady, N.Y.

[21] Appl. No.: 835,067

[22] Filed: Sep. 21, 1977

[51] Int. Cl.$^2$ .............................................. G05F 1/58
[52] U.S. Cl. .................................... 323/19; 307/246; 307/304; 323/22 R
[58] Field of Search ........................ 323/1, 4, 9, 16, 19, 323/22 R, 22 Z, 68, 69; 307/246, 297, 304

[56] References Cited

U.S. PATENT DOCUMENTS

| | | | |
|---|---|---|---|
| 3,508,084 | 4/1970 | Warner, Jr. ......................... | 323/22 R |
| 3,742,342 | 6/1973 | Schick ................................. | 323/22 Z |
| 3,743,923 | 7/1973 | Steudel .............................. | 307/304 |
| 4,005,353 | 1/1977 | Yokoyama ........................ | 323/22 R |
| 4,009,432 | 2/1977 | Dingwall et al. ................ | 323/4 |

OTHER PUBLICATIONS

*IBM Tech. Discl. Bull.* vol. 15, No. 8, Jan. 1973 pp. 2478-2479; "Current Regulated Ref. Diode" by Ellis, Jr.

*Primary Examiner*—Gerald Goldberg
*Attorney, Agent, or Firm*—Geoffrey Krauss; Joseph T. Cohen; Marvin Snyder

[57] ABSTRACT

A reference voltage source, relatively insensitive to changes in ambient temperature and supply voltage, utilizes a plurality of charge transfer amplifiers each having a temperature-stable amplification factor determined essentially by the ratio of two capacitances and independent of temperature-related factors. The amplifiers operate to provide a punch-through reference device with a constant current to cause generation of a stable reference voltage.

31 Claims, 3 Drawing Figures

4,165,478

REFERENCE VOLTAGE SOURCE WITH TEMPERATURE-STABLE MOSFET AMPLIFIER

BACKGROUND OF THE INVENTION

The present invention relates to temperature-stable semiconductor circuits and, more particularly, to a novel voltage reference source with semiconductor amplifiers, which source is both integratable and temperature- and voltage-insensitive.

Analog-to-digital converters (ADC), such as are used in digital control and signal processing systems, generally utilize a voltage reference source which must be insensitive to changes not only in the supply voltage to the voltage reference source and to the ADC but also to changes in ambient temperature. It is desirable to implement a supply- and temperature-insensitive reference voltage source particularly utilizing MOSFET technology, to facilitate incorporation of a reference voltage source upon the same semiconductor chip as the ADC. Additionally, facilitation of a reference voltage source in MOSFET technology would be useful for combining the reference source and its companion ADC in a single chip with microprocessing circuitry for utilization as an analog-input microcontroller.

It is known that MOSFET circuits are relatively temperature-dependent in operation, in that the threshold voltage of a MOSFET device tends to decrease with increasing temperature, typically at a rate of several millivolts per degree centigrade, and that the carrier mobility is also temperature-dependent with the mobility varying at room temperatures, typically to the negative three-half power of temperature. Thus, a voltage reference source and its associated amplifiers, which are immune to threshold voltage and carrier mobility effects, is highly desirable.

BRIEF SUMMARY OF THE INVENTION

In accordance with the invention, a reference voltage source has a reference means, preferably of the punch-through semiconductor type, which provides a stable reference voltage when supplied with an essentially constant current by a first semiconductor device, such as a MOSFET, having a voltage input derived from the reference voltage itself, via a temperature-stable amplifier with a gain selected to cause the punch-through reference device to operate in a completely temperature-insensitive mode; a second semiconductor device, in series connection with the first semiconductor device, is driven by a second temperature-stable amplifier, also receiving the reference voltage as its input, to minimize the effect of supply voltage variations.

In a presently preferred embodiment, each temperature-stable amplifier utilizes a plurality of integratable MOSFET transistors and charge storage techniques whereby the amplifier gain is essentially equal to a ratio of a pair of electrical capacitances whereby physically realizable capacitors provide said ratio with high stability over a relatively wide range of temperatures. A start-up circuit is utilized to assure that proper initiation of the amplification process is achieved upon initial energization of the reference voltage source.

Accordingly, it is one object of the present invention to provide a novel reference voltage source.

It is another object of the present invention to provide a novel reference voltage source having a high degree of temperature stability.

It is still another object of the present invention to provide a novel temperature-stable semiconductor amplifier usable in a novel reference-voltage source.

These and other objects of the present invention will become apparent upon consideration of the following detailed description taken in conjunction with the drawings.

DETAILED DESCRIPTION OF THE INVENTION

Figure 1:
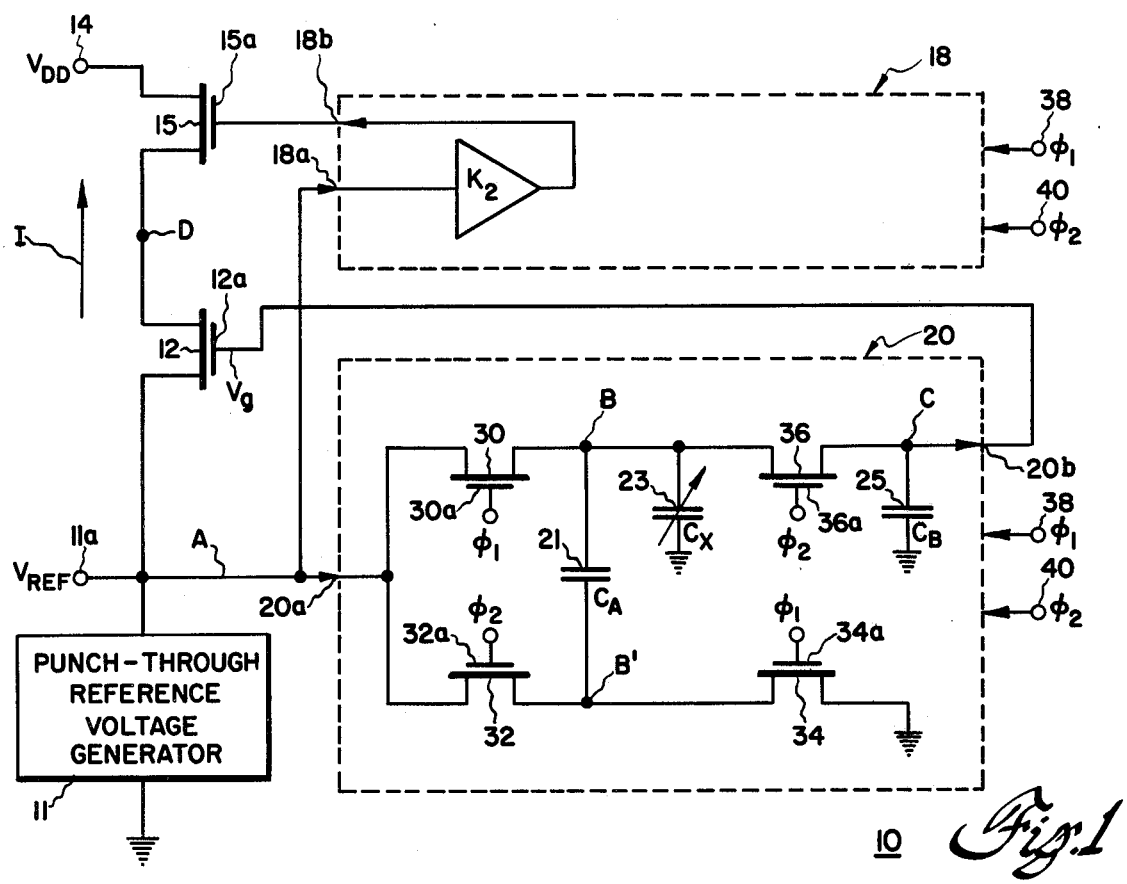
FIG. 1 is a partially-schematic block diagram of a novel reference voltage source in accordance with the principles of the present invention.

Referring now to FIG. 1, reference voltage source 10 comprises a reference voltage generator 11, such as a known punch-through semiconductor device, preferably of the MOSFET type, which generates a temperature-stable reference voltage $V_{REF}$ thereacross, when a constant current I is caused to flow therethrough. This constant current is supplied by a first transistor 12 having its drain-source circuit generally coupled between a source (not shown) of supply voltage of magnitude $V_{DD}$, at terminal 14, and the output voltage terminal 11a of reference means 11, the remaining terminal of which is coupled to electrical ground potential.

As the supply voltage may vary, with time, temperature, etc., a second transistor 15 has its drain-source circuit in series connection between supply terminal 14 and the source-drain circuit of the first transistor 12, and operates as a source follower to minimize the effect of supply voltage $V_{DD}$ variation. Advantageously, transistors 12 and 15 are of the MOSFET variety, as are other transistors having functions described hereinbelow, to facilitate fabrication of the reference voltage source upon the same semiconductor chip as other circuitry (not shown) utilizing the temperature-stable reference voltage available at output terminal 11a. In the illustrated presently preferred embodiment, all MOSFET transistors are of the p-channel type, whereby supply voltage $V_{DD}$ is a voltage less than zero volts and hence current I flows from ground toward supply voltage terminal 14, as indicated by the direction of arrow I. It should be understood that n-channel MOSFET transistors can be equally as well utilized with corresponding changes in polarity of supply voltage and current flow; it should also be understood that other semiconductor devices, including, but not limited to, junction field-effect transistors, may also be utilized in our novel circuitry.

An amplifier 18 has its input 18a coupled to node A (the reference voltage output node) and an output 18b coupled to a gate electrode 15a of transistor 15. The voltage at amplifier output 18b is thus equal to the input voltage ($V_{REF}$) times the gain $K_2$ of amplifier 18. If the magnitude of amplifier gain $K_2$ is essentially time- and temperature-invariant, the voltage $V_D$ at node D (the supply voltage to the current source transistor 12) is essentially independent of changes in supply voltage $V_{DD}$ and is approximately $$V_D = K_2 V_{REF} - V_{T1}$$

where $V_{T1}$ is the threshold voltage of transistor 15.

Another temperature-stable amplifier 20 has its input 20a coupled to the reference voltage output node A and has its output 20b coupled to a gate electrode 12a of current source transistor 12. Amplifier 20 provides an essentially time- and temperature-stable gain $K_1$ between its input and output.

In operation, transistor 12 operates as a current source if the drain voltage $V_D$ thereof, at node B, is more negative than the voltage $V_g$ applied to a gate electrode 12a with respect to ground. The gate voltage, at amplifier output 20b, is equal to the amplifier input voltage $V_{REF}$ times the gain $K_1$ of amplifier 20. Thus, transistor 12 operates as a current source if $$|K_2 V_{REF} - V_{T1}| > |K_1 V_{REF}|, \text{ or if}$$

$$K_2 > K_1 + (V_{T1}/V_{REF}).$$

The temperature coefficient of reference voltage generator 11 may, over a specified temperature range, be positive, negative or substantially zero, dependent upon the magnitude of the current I flowing through the generator. As previously stated, transistor 12 acts as a current source to drain current, in the illustrated embodiment, from generator means 11; the magnitude of current I is determined by transistor 12 and is given by the expression $$I = (C_0 \mu / 2)(W/L)(V_g - V_{REF} - V_T)^2$$

where $C_0$ is the oxide capacitance for the particular MOSFET utilized for transistor 12, $\mu$ is the carrier mobility in the channel of the device used for transistor 12, W/L is the width-to-length ratio of the transistor channel, and $V_T$ is the threshold voltage of transistor 12

The dependence of carrier mobility $\mu$ with temperature, over the range of temperatures desired, has a negative temperature coefficient, approximated by $$\mu \approx \mu_0 T^{-3/2}$$

and the dependence of the threshold voltage $V_T$ upon temperature has a negative temperature coefficient, as approximately given by $$V_T \approx V_{T_0} - m\Delta T$$

where $\mu_o$ is a reference carrier mobility and $V_{T_0}$ is a reference threshold voltage, both measured at a temperature within the range of interest; $\Delta T$ is the difference in temperature between the operating temperature and the measurement temperature; and m is a threshold voltage temperature dependence constant. Thus, an increase in temperature causes carrier mobility to decrease, with resulting decrease in the magnitude of current I, whereas the same increase in temperature also causes $V_T$ to decrease with an increase in the magnitude of current I. Therefore, the net effect of a temperature change may be to either increase or decrease the magnitude of current I, dependent upon the value of the voltage $V_g$ at gate electrode 12a. If the magnitude of the gate voltage $V_g$ is chosen to cause the change in current, with temperature, to be essentially zero, then the current flowing through the reference voltage generator means, preferably a punch-through transistor device, causes the generator to operate in an essentially temperature-insensitive manner, and the output voltage, at output terminal 11a, is maintained at an essential constant magnitude $V_{REF}$. Once the correct value of gate voltage to maintain the current in essentially temperature-insensitive manner, is known, then the temperature stability of the source is dependent upon the amplitude stability, with respect to temperature, of amplifier 20.

Amplifier 20 comprises a first charge storage means 21, such as a fixed capacitance of magnitude $C_A$, and having a pair of electrodes one of which is coupled to node B and the other to node B'; a second charge storage means, such as a variable capacitance of magnitude $C_X$, is coupled between node B and ground; and a buffer charge storage means 25, such as a fixed capacitance of magnitude $C_B$, connected between ground and node C, the output of the amplifier. The source-drain circuits of first and second switching transistors 30 and 32, respectively, are respectively coupled between amplifier input 20a and respective nodes B and B'. The source-drain circuit of a third switching transistor 34 is coupled between node B' and electrical ground, while the source-drain circuit of a fourth switching transistor 36 is coupled between nodes B and C. Gate electrodes 30a and 34a of switching transistors 30 and 34, respectively, are coupled to a first switching voltage $\phi_1$, supplied to each amplifier at a first switch drive input 38, and gate electrodes 32a and 36a of switching transistors 32 and 36, respectively, receive a second switching voltage $\phi_2$ from a second switch drive input terminal 40. The means utilized to provide the required switching waveforms $\phi_1$ and $\phi_2$, and the proper magnitudes thereof, are known to the art and form no portion of the present invention. The charge storage means may be physically realized by MOS capacitors and the transistors by MOSFETs fabricated in a monolithic semiconductor integrated circuit; hybrid and discrete component realizations are also within the scope of the present invention.

Figure 2:
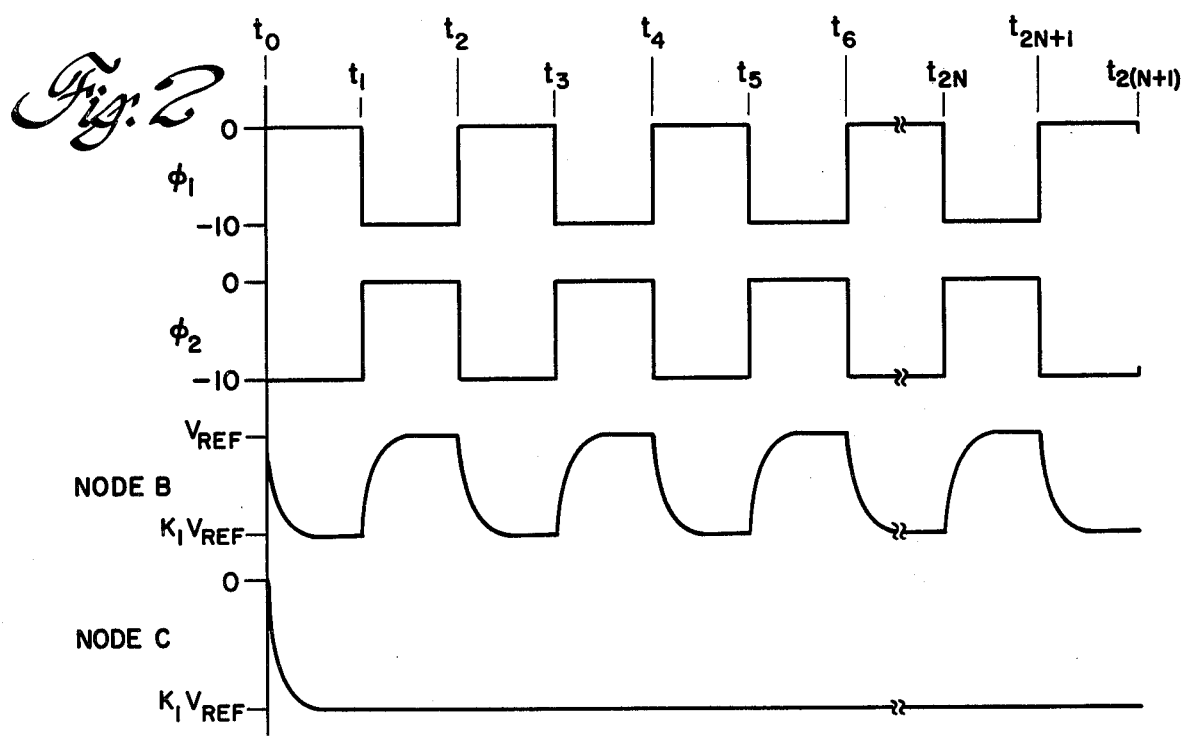
FIG. 2 is a set of interrelated timing diagrams illustrating selected waveforms obtained in the circuit of FIG. 1 and useful in understanding the present invention.

Referring now more particularly to FIG. 2, the coordinated waveforms for the first and second switching signals $\phi_1$ and $\phi_2$, as well as the voltage waveforms at nodes B and C are illustrated. It should be emphasized that, as transistors 30, 32, 34 and 36 are illustrated as p-channel devices, a signal of negative magnitude is required to turn the devices to the "on", or saturated, condition, while a light substantially of zero volts controls the transistor to the "off" condition. It should be further emphasized that, while the switching signals $\phi_1$ and $\phi_2$ appear to be complements of each other, the signals are actually such that only one pair of transistors 30 and 34 or 32 and 36 are in the "on" condition at any one time; the frequency of the driving signals and the duration of each portion thereof need have no fixed value, other than that the duration of the time interval during which each pair of switching transistors is in the "on" condition is sufficiently greater than the associated circuit time constant, hereinbelow discussed, to allow the voltage to reach its final value.

At some time shortly prior to time $t_0$, switching voltage $\phi_1$ is at a low level, e.g., $-10$ volts, whereby switching transistors 30 and 34 are in the "on" condition. Thus, node B is coupled, via the saturation resistance of the drain-source circuit of transistor 30, to input 20a, while node B' is coupled, via the drain-source resistance of saturated transistor 34, to ground. First capacitance means 21 charges to the input voltage, $V_{REF}$, with a time constant determined by the capacitance $C_A$ of capacitance means 21 and the sum of the saturation resistances of transistors 30 and 34. Thus, at time $t_0$ the voltage across capacitor 21, e.g. the voltage at node B, is equal to the reference source output voltage. It is assumed that the circuit is commencing output operation at $t_0$ and that the voltage at node C is thus essentially zero volts. At time $t_0$, switching signal $\phi_1$ goes high, e.g. to zero volts, and drives transistors 30 and 34 into the "off" condition, while switching signal $\phi_2$ goes low, causing saturation of switching transistors 32 and 36. Node B' is now connected to the reference voltage, at the amplifier input 20a. Node B would, if capacitors 23 and 25 were not present, jump to a voltage equal to twice that of the reference output. However, as capacitor 23 was charged to a voltage essentially equal to $V_{REF}$ while first switching signal $\phi_1$ is low, node B is prevented from jumping to a value of $2V_{REF}$, as the voltage across capacitance $C_X$ cannot change instantaneously. Thus, the voltage $V_B$ at node B exponentially approaches a value given by $$V_B = V_{REF}(1 + (C_A/(C_A + C_X)))$$

assuming that capacitance $C_B$ is much less than capacitance $C_X$. If a current source device 12 having a very high gate input resistance is utilized, the amount of charge withdrawn from capacitor 25 is very small, whereby the amount of charge that is needed to keep node C charged to the same voltage as the voltage at node B is small (assuming a very small magnitude of leakage from node C due to all other causes) and capacitance $C_B$ may be several orders of magnitude less than the magnitude of capacitance $C_X$. Thus, if the time interval $(t_1 - t_0)$ is greater than about five time constants, $V_B$ is equal to $V_{REF}(1 + (C_A/(C_A + C_X)))$, by time $t_1$.

The second switching signal $\phi_2$ also controls transistor switch 36 to its "on" condition to cause charge to be transferred to capacitor 25. The amplifier output voltage $V_C$ is thus changed to $V_B$ with a time constant proportionate to the saturation resistance of the source-drain circuit of transistor 36 and the capacitance $C_B$ whereby $V_C$ essentially follows the charging curve of $V_B$. The output voltage of the amplifier and the gate electrode voltage of transistor 12 at time $t_1$ is thus $$V_C = V_g = V_{REF}(1 + C_A/(C_A + C_X)) = K_1 V_{REF}, \text{ or}$$

$$K_1 = (1 + C_A/(C_A + C_X)).$$

Thus, when switching signal $\phi_2$ is low, e.g. during time intervals $(t_0$ to $t_1) \ldots (t_{2N}$ to $t_{2N+1})$, where N is an integer greater than zero, node B charges to a voltage $V_B = K_1 V_{REF}$, with a time constant determined by the "on" drain-source resistance of transistor 32 and the effective capacitance of capacitors 21 and 23 in series. Similarly, when switching voltage $\phi_2$ turns "off" and switching voltage $\phi_1$ turns "on", e.g. during time intervals $(t_1$ to $t_2), \ldots (t_{2N+1}$ to $t_{2(N+1)})$, the voltage at node B exponentially returns to the reference output voltage $V_{REF}$, with a time constant proportional to the magnitude of capacitor 21 and the series resistances of the drain-source circuits of transistors 30 and 34; as switching voltage $\phi_2$ is substantially zero, during these time intervals, transistor 36 is "off" and buffer capacitor 25 (and the amplifier output) is connected only to the gate electrode of current source transistor 12. Thus, the magnitude of $V_g$ is maintained essentially at $K_1 V_{REF}$, even during those portions of a charge transfer cycle when capacitor 21 is again connected only between amplifier input 20a and ground, and the magnitude of $C_X$ is adjusted by known techniques and means, to realize the required gain.

It should be understood that amplifier 18 may be identical to amplifier 20, with the values $C_A$ and $C_X$, respectively of capacitor means 21 and 23, being established to comply with the aforementioned criteria that $K_2 > K_1 + (V_{T1}/V_{REF})$.

Figure 3:
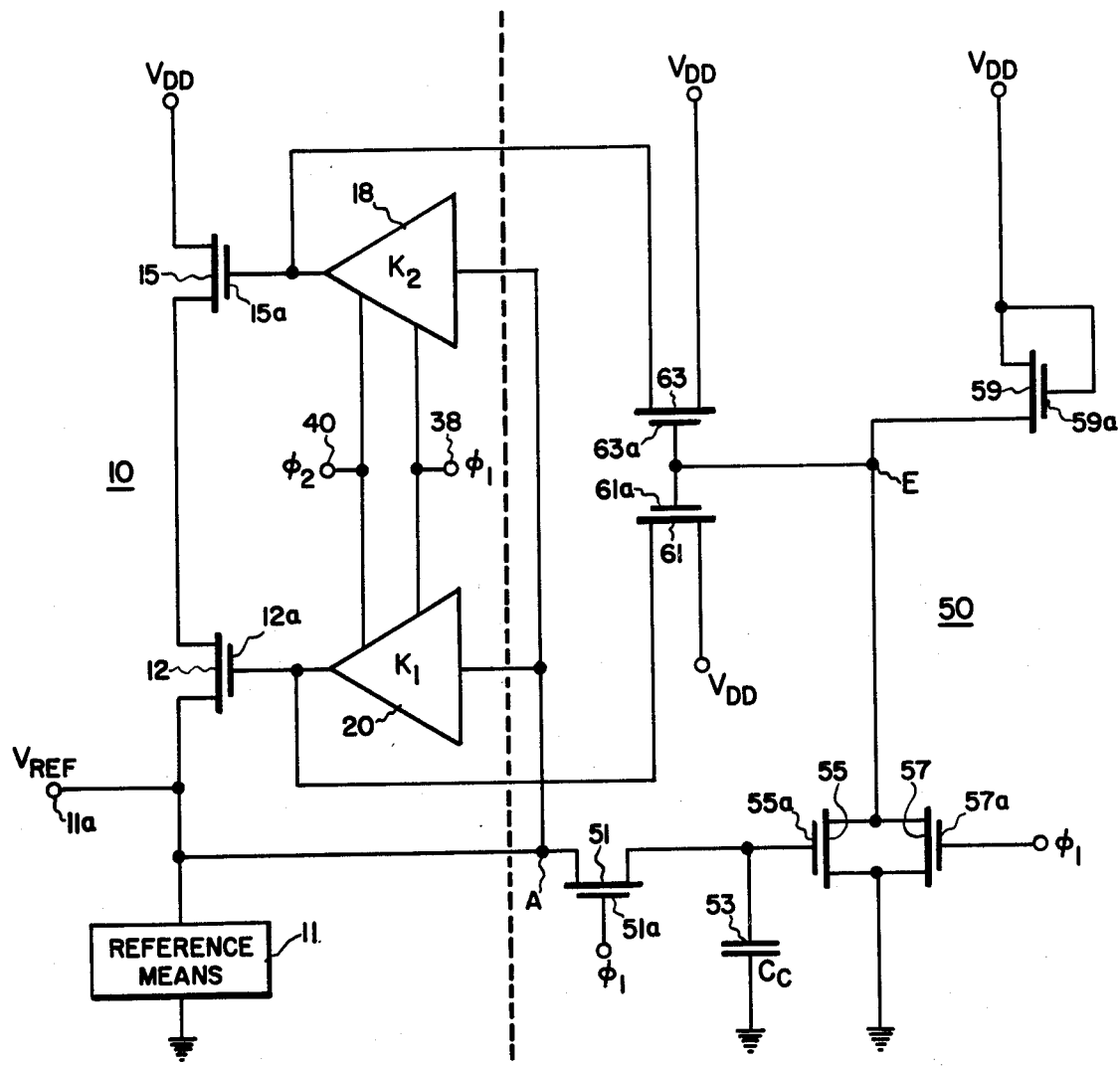
FIG. 3 is a partially-schematic block diagram of the novel reference voltage source and of a start-up circuit useful therewith.

Referring now to FIG. 3, wherein like reference designations refer to like elements, a start-up circuit 50 is required in a practical implementation of voltage reference generator 10 to provide an initial voltage at node A, as at circuit turn-on, when (because of the threshold voltage drops and a lack of bootstrapping action (without circuit 50)), the source may not function in proper fashion. Circuit 50, insuring that an initial voltage is applied at node A, comprises a switching transistor 51 having its gate electrode 51a coupled to switching signal $\phi_1$ and having its source-drain circuit coupled between node A and one terminal of a capacitor means 53, having its remaining terminal connected to electrical ground. Capacitor means 53, having a fixed capacitance magnitude $C_C$, is also coupled between the gate electrode 55a and the source of a transistor 55, having its source-drain circuit coupled between electrical ground and a node E, in parallel with the source-drain circuit of another transistor 57, having its gate electrode 57a coupled to switching voltage $\phi_1$. A transistor 59 has its drain-source circuit coupled between supply voltage $V_{DD}$ and node E, with a gate electrode 59a coupled back to supply voltage to act as a load resistance for paralleled transistors 55 and 57. A pair of steering transistors 61 and 63 have their gate electrodes 61a and 63a, respectively, connected together and to node E and have their drain-source circuits coupled between supply voltage $V_{DD}$ and the outputs of first amplifier 20 and second amplifier 18, respectively. In operation, when the supply voltage is initially applied to the reference voltage source, the voltage at node A is zero volts. As soon as switching signal $\phi_1$ goes to its negative value, transistor 51 is turned to the "on" condition and establishes the voltage across capacitor 53 at zero volts. This voltage is coupled to gate electrode 55a and places transistor 55 in the "off" condition. As soon as switching signal $\phi_1$ returns to zero voltage, the "off" condition, transistor 57 is also controlled to the "off" condition and the voltage at node E falls toward supply voltage $V_{DD}$, as current is not drawn through transistor 59 by either of transistors 55 and 57. Transistors 61 and 63 now act as voltage followers and cause the voltage at the gate electrodes 12a and 15a of transistors 12 and 15, respectively, to fall toward supply voltage $V_{DD}$, causing transistors 12 and 15 to conduct heavily and raise the voltage at node A, until the reference means voltage $V_{REF}$ approaches its normal value and can be stabilized by the action of amplifiers 18 and 20. Once the reference generator is in normal operation, the reference voltage, at node A, is applied across capacitor 53 whenever switching signal $\phi_1$ is in the "on" condition. Charging capacitor 53 to the reference voltage controls transistor 55 to the "on" condition, whereby when switching signal $\phi_1$ reverts to the "off" condition, transistor 55 remains conducting, as the amount of charge drawn from capacitor 53 is extremely small. With transistor 55 in the conducting condition, the voltage at node E, and therefore at gate electrode 61a and 63a, is substantially at zero volts, whereby transistors 61 and 63 are controlled to the "off" condition and have no further effect on the operation of transistors 12 and 15, respectively.

Performance with temperature-stable amplifiers 18 and 20 of the charge-transfer type (as shown in FIG. 1) can be appreciated from a typical design, wherein $V_{DD}$ is about $-20$ volts. A gate voltage $V_g$ of about $-16.0$ volts causes transistor 12 to generate an optimum current I. The reference source output voltage $V_{REF}$ is established, by current I, at $-12.791$ volts, whereby gain $K_1=(V_g/V_{REF})=(-16.0/-12.791)=1.25$. The circuit maintains an output voltage of $V_{REF}=-12.791\pm0.002$ volts DC over a 100° C. temperature cycle during a 10-day test period.

While a preferred embodiment of the present invention has been described, many variations and modifications will now become apparent to those skilled in the art. It is our intent, therefore, to be limited only by the scope of the appended claims and not by the specific embodiments disclosed herein.

What is claimed is:

1. A temperature-stable reference voltage source, devoid of passive resistance elements, comprising:
a power terminal;
means for supplying an electrical potential of unknown amplitude stability to said power terminal;
first and second output terminals;
means connected between said output terminals for generating an essentially constant coltage responsive to a flow of an essentially constant current therethrough
first means only in electrical series connection with said generating means for causing a current flow from said potential supplying means only through said generating means with a magnitude responsive to the magnitude of a signal supplied to said first means; and
temperature-stable amplifier means for supplying, responsive only to the magnitude of the voltage across said output terminals, said signal to said first means to cause the magnitude of said current flow to remain essentially constant.

2. The reference voltage source of claim 1, wherein the gain of said amplifier means is essentially constant with respect to temperature and is established by the ratio of first and second passive elements.

3. The reference voltage source of claim 1, wherein said first means is a semiconductor device having a control electrode connected to an output of said amplifier means and having a circuit connected between said potential supplying means and said generating means and in which the current flow is controlled by the voltage at said control electrode.

4. The reference voltage source of claim 3, wherein said semiconductor device is a field-effect transistor.

5. The reference voltage source of claim 4, wherein said field-effect transistor is a metal-oxide-semiconductor field-effect transistor.

6. The reference voltage source of claim 1, wherein said generating means is a semiconductor punch-through device.

7. The reference voltage source of claim 1, further comprising second means responsive to the output of said reference voltage source for substantially removing variations with respect to time in the magnitude of the electrical potential applied to said first means by the potential supplying means.

8. A temperature-stable reference voltage source comprising:
means for supplying an electrical potential of unknown amplitude stability;
first and second output terminals;
means connected between said output terminals for generating an essentially constant voltage responsive to a flow of an essentially constant current therethrough;
first means for causing a current to flow through said generating means with a magnitude responsive to the magnitude supplied to said first means; and
temperature-stable amplifier means for supplying, responsive to the magnitude of the voltage across said output terminals, said signal to said first means to cause the magnitude of said current flow to remain essentially constant; the gain of said amplifier means being established by the ratio of first and second passive elements which are capacitors.

9. The reference voltage source of claim 8, wherein the capacitance of one of the capacitors is of variable magnitude, for adjustably establishing the gain of said amplifier means.

10. The reference voltage source of claim 8, wherein said capacitors are metal-oxide-semiconductor capacitors.

11. A temperature-stable reference voltage source comprising:
means for supplying an electrical potential of unknown amplitude stability;
first and second output terminals;
means connected between said output terminals for generating an essentially constant voltage responsive to a flow of an essentially constant current therethrough;
first means for causing a current to flow through said generating means with a magnitude responsive to the magnitude of a signal supplied to said first means; and
temperature-stable amplifier means for supplying, responsive to the magnitude of the voltage across said output terminals, said signal to said first means to cause the magnitude of said current flow to remain essentially constant; said amplifier means comprising first charge storage means having first and second terminals; second charge storage means having a first terminal connected to the first terminal of said first charge storage means and having a second terminal coupled to the second output terminal of said reference voltage source; first switching means for simultaneously connecting the first and second terminals of said first charge storage means respectively to the first and second output terminals; and second switching means for selectably connecting the second terminal of said first charge storage means to said first output terminal and for connecting said first terminals of said first and second charge storage means to said first means when said first switching means is disabled.

12. The reference voltage source of claim 11, wherein said first switching means comprises a first switching transistor having a drain-source circuit coupled between said first storage means first terminal and said first output terminal; and a second switching transistor having a drain-source circuit connected between said first storage means second terminal and said second output terminal; said first and second switching transistors being controlled simultaneously to a low resistance condition when said ffirst switching means is enabled.

13. The reference voltage source of claim 12, wherein said second switching means comprises a third switching transistor having a drain-source circuit coupled between said first storage means second terminal and said first output terminal; and a fourth switching transistor having a drain-source circuit connected between the first terminals of said first and second storage means and said first means; said third and fourth switching transistors being controlled simultaneously to a low resistance condition when said second switching means is enabled.

14. A temperature-stable reference voltage source comprising:
   means for supplying an electrical potential of unknown amplitude stability;
   first and second output terminals;
   means connected between said output terminals for generating an essentially constant voltage responsive to a flow of an essentially constant current therethrough;
   first means for causing a current to flow through said generating means with a magnitude responsive to the magnitude of a signal supplied to said first means;
   temperature-stable amplifier means for supplying, responsive to the magnitude of the voltage across said output terminals, said signal to said first means to cause the magnitude of said current flow to remain essentially constant; and
   second means responsive to the output of said reference voltage source for substantially removing variations with respect to time and the magnitude of the electrical potential applied to said first means by the potential supplying means; said second means comprising third means connected between said potential supplying means and said first means for supplying to said first means a voltage of said amplitude proportional to the magnitude of another signal; and another temperature-stable amplifier means responsive to the magnitude of the voltage across said output terminals for supplying said another signal.

15. The reference voltage source as set forth in claim 14, wherein said third means is a field-effect transistor having a drain-source circuit coupled between said potential supply means and said first means, said field-effect transistor having a control electrode receiving the amplified reference voltage source output of said another amplifier means, for operation as a source follower.

16. The reference voltage source of claim 15, wherein the gain of said another amplifier means is established by the ratio of first and second passive elements.

17. The reference voltage source of claim 16, wherein said first and second passive elements are capacitors.

18. The reference voltage source of claim 17, wherein the capacitance of one of the capacitors is of variable magnitude, for adjustably establishing the gain of said another amplifier means.

19. A temperature-stable reference voltage source comprising:
   means for supplying an electrical potential of unknown amplitude stability;
   first and second output terminals;
   means connected between said output terminals for generating an essentially constant voltage responsive to a flow of an essentially constant current therethrough;
   first means for causing a current to flow through said generating means with a magnitude responsive to the magnitude of a signal supplied to said first means;
   temperature-stable amplifier means for supplying, responsive to the magnitude of the voltage across said output terminals, said signal to said first means to cause the magnitude of said current flow to remain essentially constant; and
   start-up means including means for providing a signal if less than a preselected voltage amplitude appears across said output terminals; and transistor voltage follower means responsive to the signal from said providing means for enabling said first means to cause an initial flow of current through said generating means when operation of said reference voltage source commences.

20. The reference voltage source of claim 19, wherein said providing means comprises first and second switching devices each having a control electrode and a pair of electrodes having a resistance therebetween controlled by the amplitude of voltage as the associated control electrode, the controlled resistances of said first and second devices being connected in electrical parallel; means for providing an electrical current to the parallel pair of control resistances; means coupled to the control electrode of one of said first and second devices for storing the amplitude of a voltage coupled thereto; and means for coupling the voltage output of said generating means to said storing means; said coupling means and the control electrode of the remaining one of said first and second devices being periodically and alternately enabled.

21. The reference voltage source of claim 20, wherein said first and second switching devices are field-effect transistors.

22. The reference voltage source of claim 20, wherein said storing means is a capacitor.

23. A temperature-stable amplifier, comprising:
   an input terminal, an output terminal and a common terminal;
   first charge storage means having first and second terminals;
   second charge storage means having a first terminal connected to the first terminal of said first charge storage means and having a second terminal connected to said amplifier common terminal;
   first switching means for selectively connecting the first terminals of said first and second charge storage means to said input terminal and for simultaneously connecting said first charge storage means second terminal to said amplifier common terminal, said first and second charge storage means charging to a voltage present between said input and amplifier common terminals when said first means is enabled;
   second switching means for selectively connecting said first charge storage means second terminal to said input terminal and for simultaneously connecting said first terminals of said first and second charge storage means to said amplifier output terminal when said first switching means is disabled;
   means for alternately enabling said first and second switching means in mutually exclusive fashion; and
   third charge storage means coupled between said output and amplifier common terminals for storing charge transferred thereto when said second means is operative and for maintaining a voltage at said output terminal proportional to the charge stored in said third storage means even when said second means is disabled.

24. The amplifier as set forth in claim 23, wherein said first switching means comprises a first switching transistor having a drain-source circuit coupled between said first storage means first terminal and said input terminal; and a second switching transistor having a drain-source circuit connected between said first storage means second terminal and said amplifier common terminal; said first and second switching transistors having their respective drain-source circuits controlled simultaneously to a low resistance condition when said first switching means is enabled.

25. The amplifier set forth in claim 23, wherein said first, second and third charge storage means are capacitors.

26. The amplifier as set forth in claim 25, wherein said capacitors are of the metal-oxide-semiconductor type.

27. The amplifier as set forth in claim 25, wherein the gain of said amplifier is established by the ratio of said first and second capacitors.

28. The amplifier of claim 23, wherein said second switching means comprises a third switching transistor having a drain-source circuit coupled between said first storage means second terminal and said input terminal; and a fourth switching transistor having a drain-source circuit connected between said first storage means first terminal and said output terminal; the drain-source circuits of said third and fourth switching transistors being controlled simultaneously to a low resistance condition when said second switching means is enabled.

29. The amplifier of claim 28, wherein said first through fourth switching transistors are field-effect transistors.

30. The amplifier of claim 29, wherein said field-effect transistors are of the metal-oxide-semiconductor type.

31. The amplifier of claim 29, wherein said first, second and third charge storage means are respective first, second and third electrical capacitances; the magnitude of said third capacitance being much less than the magnitude of said first and second capacitances; and the gain of said amplifier means being established by the ratio of said first and second capacitances.

* * * * *